US009671817B1

(12) United States Patent
Thielen

(10) Patent No.: US 9,671,817 B1
(45) Date of Patent: Jun. 6, 2017

(54) ACCUMULATOR-BASED PHASE MEMORY

(71) Applicant: Raytheon Company, Waltham, MA (US)

(72) Inventor: Michael Thielen, Brea, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/187,895

(22) Filed: Jun. 21, 2016

Related U.S. Application Data

(63) Continuation of application No. 14/953,464, filed on Nov. 30, 2015, now abandoned.

(51) Int. Cl.
*H03L 7/00* (2006.01)
*G06F 1/03* (2006.01)
*H03K 23/50* (2006.01)

(52) U.S. Cl.
CPC ......... *G06F 1/0335* (2013.01); *H03K 23/502* (2013.01); *H03L 7/00* (2013.01)

(58) Field of Classification Search
USPC ........................................................ 327/160
See application file for complete search history.

(56) References Cited

U.S. PATENT DOCUMENTS

| 5,084,681 | A | 1/1992 | Kovalick et al. | |
|---|---|---|---|---|
| 7,440,987 | B1 * | 10/2008 | Song | G06F 1/0353 708/276 |
| 7,768,355 | B2 | 8/2010 | Patterson | |
| 8,878,620 | B2 | 11/2014 | Sauerwein | |
| 2004/0053709 | A1 | 3/2004 | Sullivan et al. | |
| 2006/0279365 | A1 * | 12/2006 | Camuffo | H03L 7/093 331/16 |
| 2008/0005213 | A1 | 1/2008 | Holtzman | |
| 2012/0025879 | A1 * | 2/2012 | Matsuda | H03L 7/085 327/156 |
| 2014/0240004 | A1 * | 8/2014 | Fawley | G06F 1/0335 327/106 |

* cited by examiner

*Primary Examiner* — Lincoln Donovan
*Assistant Examiner* — Patrick Chen
(74) *Attorney, Agent, or Firm* — Cantor Colburn LLP

(57) ABSTRACT

Embodiments relate to an accumulator-based phase memory. An aspect includes a phase correction calculator configured to, based on receipt of a new frequency tuning word on a frequency tuning word input, determine a phase difference between the new frequency tuning word and a current frequency tuning word, and determine a product of the phase difference and a value of a counter. Another aspect includes wherein the accumulator-based phase memory determines a phase offset value based on the product of the phase difference and the value of the counter. Another aspect includes the accumulator-based phase memory further comprising a waveform generator configured to generate a waveform based on the new frequency tuning word and the phase offset value.

20 Claims, 5 Drawing Sheets

ACCUMULATOR-BASED PHASE MEMORY

DOMESTIC BENEFIT/NATIONAL STAGE INFORMATION

This application is a continuation of U.S. application Ser. No. 14/953,464, entitled "ACCUMULATOR-BASED PHASE MEMORY", filed Nov. 30, 2015, which is incorporated herein by reference in its entirety.

BACKGROUND

The present disclosure relates to phase memory, and more particularly to an accumulator-based phase memory.

Phase memory is used to support generation of multiple time-interleaved coherent output frequencies in a radar, electronic warfare, or other communications system that uses only a single RF channel. Phase memory allows a local oscillator (LO) and its associated radio frequency (RF) up/down converters to switch from one LO frequency to another LO frequency (or to multiple LO frequencies) and then back to the first LO frequency while maintaining phase, allowing the single RF channel to be time-multiplexed with many frequency bands. If the phase of the signal is not coherent upon a switch (i.e., as if LO had never left a previous frequency), the signal may be cancelled out or processed incorrectly at a receiver.

Phase memory may be used for switching frequencies in, for example, a RF system or subsystem that is used in a jammer for an electronic warfare applications. To exploit radar's coherent processing interval (CPI) gain in an electronic warfare application, a jammer outputs a phase-coherent pulse train. Generated jammer transmissions must appear to be cut from a phase-continuous sine wave in order to be effective at the receiver (e.g., the victim radar).

SUMMARY

Embodiments relate to an accumulator-based phase memory. An aspect includes a phase correction calculator configured to, based on receipt of a new frequency tuning word on a frequency tuning word input, determine a phase difference between the new frequency tuning word and a current frequency tuning word, and determine a product of the phase difference and a value of a counter. Another aspect includes wherein the accumulator-based phase memory determines a phase offset value based on the product of the phase difference and the value of the counter. Another aspect includes the accumulator-based phase memory further comprising a waveform generator configured to generate a waveform based on the new frequency tuning word and the phase offset value.

Further embodiments relate to a method of operating an accumulator-based phase memory. An aspect includes, based on receipt of a new frequency tuning word on a frequency tuning word input of the accumulator-based phase memory, determining a phase difference between the new frequency tuning word and a current frequency tuning word. Another aspect includes determining a product of the phase difference and a value of a counter. Another aspect includes determining a phase offset value based on the product of the phase difference and the value of the counter. Yet another aspect includes generating a waveform based on the new frequency tuning word and the phase offset value.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
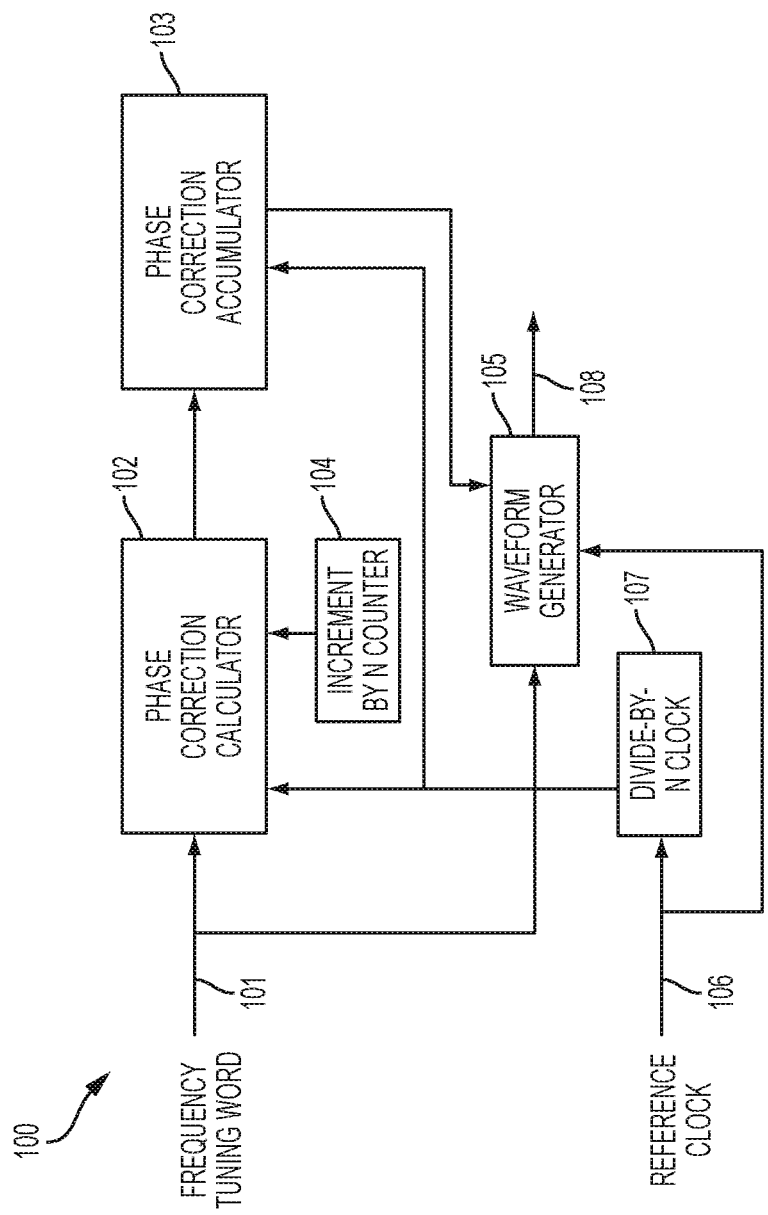
FIG. 1 is a block diagram of an accumulator-based phase memory in accordance with an embodiment.

Embodiments of accumulator-based phase memory are provided, with exemplary embodiments being discussed below in detail. The accumulator-based phase memory includes a divide-by-N clock, where N is an integer, that divides down a reference clock signal received by the accumulator-based phase memory, in conjunction with a increment-by-N counter that increments by the same number N that is used in the divide-by-N clock. The divide-by-N also allows for processing and calculation of the phase adjustment that is required to maintain phase memory at a lower clock rate, because performing the necessary calculations at higher sample clock rates (e.g., over several gigahertz, or GHz) may not be possible. The counter provides a time reference that allows the amount of time that has passed since a frequency change to be tracked. This allows the correct phase of the signal to be determined upon a frequency change back to any particular frequency. Phase coherency is maintained while switching between multiple RF bands on a single RF channel, with no knowledge required regarding when any particular frequency will be revisited. For example, in an electronic warfare application, a higher priority threat (i.e., missile seekers) may be detected at any time, necessitating a frequency change.

When a frequency change is triggered, a new frequency tuning word is sent to a phase correction calculator of the accumulator-based phase memory, and the previous frequency tuning word is subtracted from it, which provides the phase difference between the two frequency tuning words. The frequency tuning word is a delta-phase value (or dΦD/dt), which is the phase that the output sine wave is incremented by each sample clock period. This result is then passed to a multiplier which multiplies the phase difference by the value of the counter. The phase correction calculator will output a value of zero unless a frequency change is commanded. The resulting product of the phase difference and the counter reference is input to a phase correction accumulator, which accumulates all of the phase correction values, and determines a phase offset value. The accumulation of the phase offset values allows the output waveform to maintain a common phase reference when switching frequencies. The phase offset value is added to the output of a phase accumulator prior to receipt by a phase-to-amplitude converter (for example, a sine/cosine look-up-table) that outputs the waveform having the desired phase and frequency.

Embodiments of an accumulator-based phase memory may be implemented in any appropriate hardware; some embodiments may include programmable logic device such as a field-programmable gate array (FPGA) in conjunction with a digital direct synthesis (DDS) devices. In further embodiments, any appropriate programmable logic device may be used in conjunction with the DDS device, such as a digital signal processor (DSP) device or an application-specific integrated circuit (ASIC). Further embodiments may include a polyphase module in conjunction with a programmable logic device, omitting the DDS device. In some embodiments of an accumulator-based phase memory, a single FPGA may be used to synchronize multiple DDS devices. A DDS may provide a relatively high sample rate (for example, higher than about 3 GHz), and low latency tuning (on the order of nanoseconds). The divide-by-N clock may be located in the DDS, and the increment-by-N counter may be located in the FPGA. High-speed processing is performed in the FPGA. For example, the phase correction calculator and the phase correction accumulator may be located on the FPGA, and the phase accumulator may be located on the DDS. Further, the divide-by-N clock may be located in the DDS, and the increment-by-N counter may be located on the FPGA. In further embodiments in which the DDS is omitted, the phase correction calculator, the phase correction accumulator, and a polyphase module are all located on the FPGA and the output digital data stream fed to a DAC (digital-to-analog converter) for conversion to an analog sine wave.

FIG. 1 illustrates an embodiment of an accumulator-based phase memory 100. The accumulator-based phase memory 100 receives a reference clock signal 106 at a divide by-N clock 107. The divide-by-N clock 107 outputs a divided clock signal to a phase correction calculator 102. The phase correction calculator 102 also receives a frequency tuning word from frequency tuning word input 101, which indicates to the accumulator-based phase memory 100 the desired value of the output frequency 108 of the accumulator-based phase memory 100. The phase correction calculator is further in communication with an increment-by-N counter 104. The increment-by-N counter 104 continuously increments by a number N, which is the same value of N that is applied to the reference clock signal 106 by divide-by-N clock 107. While the phase memory is staying on the same frequency band, indicated by a constant input on frequency tuning word input 101, no signal is output by the phase correction calculator 102. When a new frequency tuning word is received on frequency tuning word input 101, the phase correction calculator 102 multiplies the phase difference between the current frequency tuning word (i.e., delta-phase value) and the new frequency tuning word by the value of the increment-by-N counter 104, and outputs the product to the phase correction accumulator 103. The phase correction accumulator 103 also receives the clock signal from divide-by-N clock 107, and outputs a phase offset value for the new frequency to the waveform generator 105. The waveform generator outputs a waveform corresponding to the new frequency tuning word at output 108 based on reference clock 106, the frequency tuning word input 101, and the phase offset value received from the phase correction accumulator 103. The increment-by-N counter 104 and divide-by-N clock 107 allow the accumulator-based phase memory 100 to move between frequencies and, upon returning to any particular frequency, resume the previous phase, by allowing the necessary phase calculations to be performed in a programmable logic device such as an FPGA, DSP device, or ASIC for the relatively fast high frequency sample clock (i.e. reference clock 106). An accumulator-based phase memory 100 may be implemented using any appropriate hardware; some example embodiments of implementation of an accumulator-based phase memory 100 are discussed below with respect to FIGS. 2 and 3.

Figure 2:
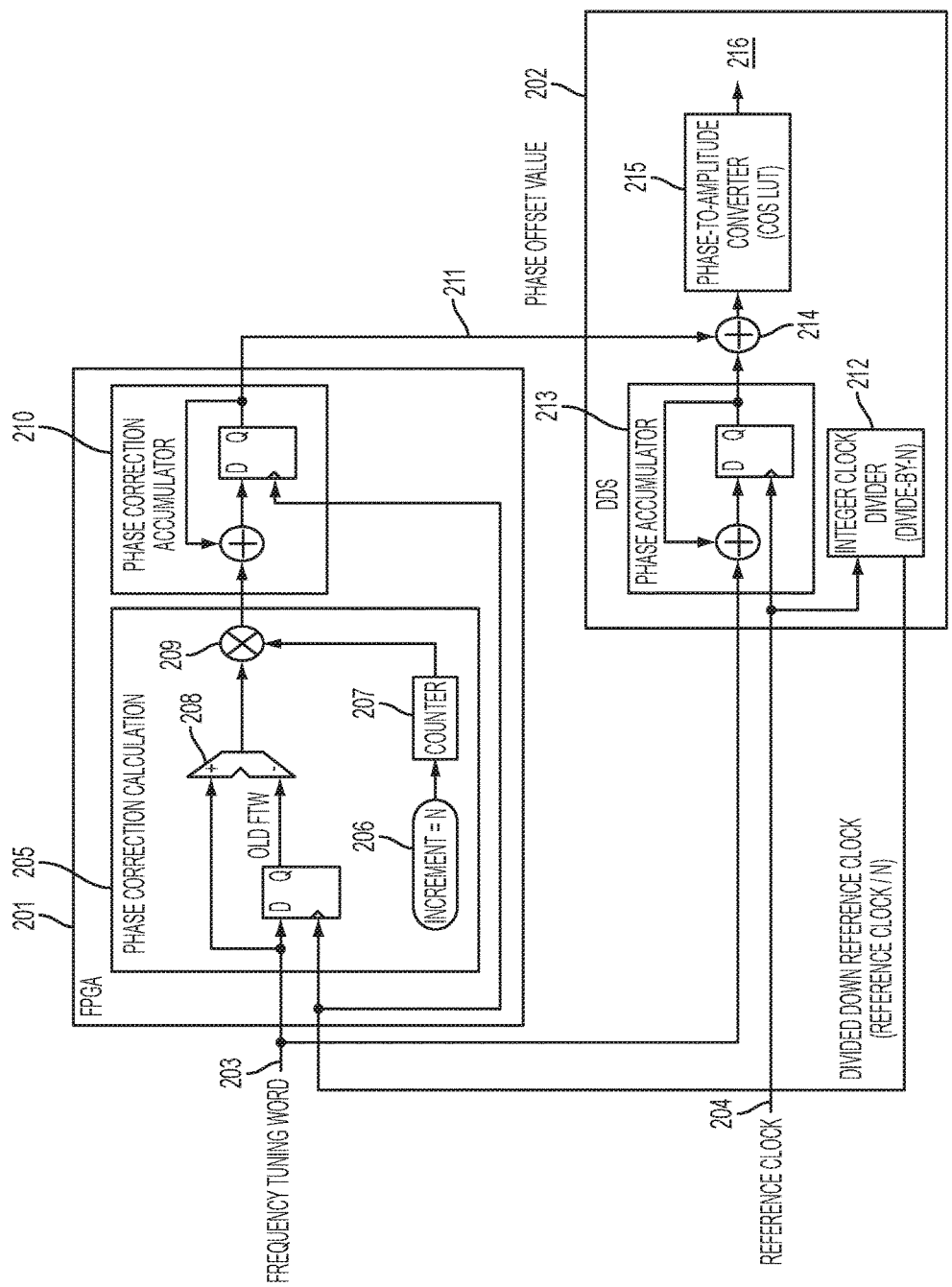
FIG. 2 is a block diagram of an accumulator-based phase memory including a programmable logic device and a digital direct synthesis (DDS) in accordance with an embodiment.

FIG. 2 illustrates an embodiment of an accumulator-based phase memory 200 that is implemented using an FPGA 201 and a waveform generator comprising a DDS 202. The DDS 202 is clocked by a reference clock 204. An integer clock divider 212 in the DDS 202 outputs a divided down version (i.e., divided by N) of reference clock 204. The divided down clock signal from the integer clock divider 212 (along with, in some embodiments, synchronization signals for use in synchronizing multiple DDS devices) is passed to phase correction calculator 205 in the FPGA 201. The phase correction calculator 205 uses a counter 207, which is incremented by an incrementer 206 using the same number N that is used in the integer clock divider 212 in the DDS 202, to track the number of clock cycles that have passed since a frequency change in order to maintain a common reference to the reference clock 204. When a frequency change is called for, a new frequency tuning word 203 is received by phase correction calculator 205, and the previous frequency tuning word, which is held via a register that is controlled by the integer clock divider 212, is subtracted from the new frequency tuning word 203 by subtractor 208, giving the resulting phase difference between the old and new frequency tuning words. The phase difference is then passed to a multiplier 209 which multiplies the phase difference by the output of the counter 207. The phase correction calculator 205 will always output a value of zero to the phase correction accumulator 210 unless a new frequency tuning word 203 is received. The product of the phase difference and the counter reference is sent from multiplier 209 in phase correction calculator 205 to the phase correction accumulator 210, which accumulates the phase correction values using a register that is controlled by the integer clock divider 212, and provides phase offset value 211 to the DDS 202. A phase accumulator 213 in the DDS 202, operating at frequency of the reference clock 204, receives the frequency tuning word 203, and comprises an adder, a loopback path, and a register that is controlled by the reference clock 204. The phase offset value 211 is added to the output of the phase accumulator 213 by an adder 214, and the sum is provided to a phase-to-amplitude (e.g., a sine/cosine look-up-table) converter 215, which outputs a waveform to a digital/analog converter (DAC) on output 216.

In some embodiments, a constant phase increment may also be added to the phase offset value 211 after the phase correction accumulator 210 and prior to receipt by the DDS 202 to account for any latency between the DDS phase accumulator 213 and the phase memory calculator 205 and phase correction accumulator 210. The accumulation of the phase correction calculations allows the output of the DDS to maintain a common phase reference when switching frequencies and to maintain phase memory. In some embodiments, a single FPGA such as FPGA 201 may control multiple DDS devices, such as DDS 202, which are synchronized together to produce multiple waveform outputs. FIG. 2 is shown for illustrative purposes only; any appropriate programmable logic device, such as a DSP device or ASIC, may perform the functions of the FPGA 201 in various embodiments.

Figure 3:
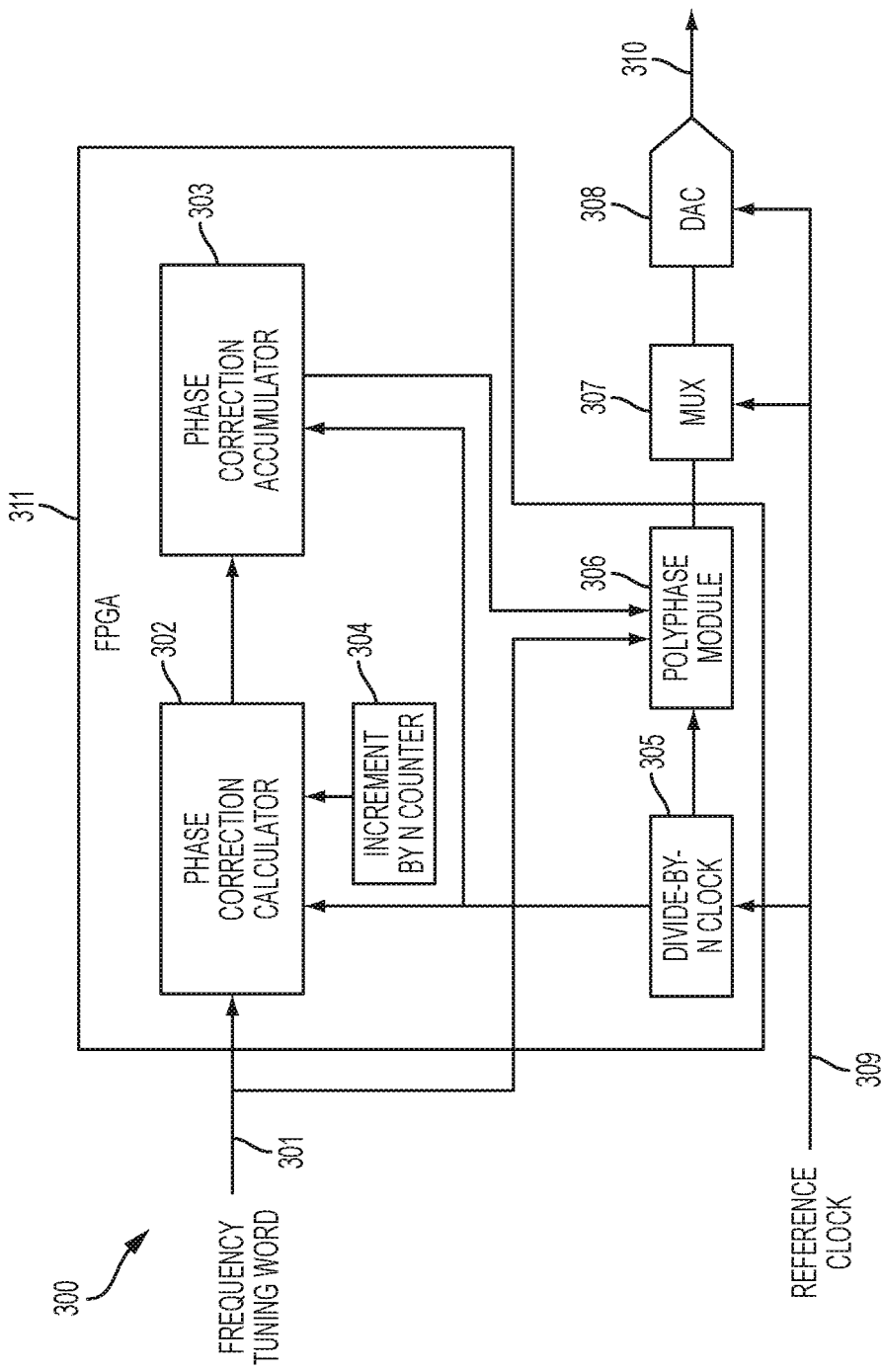
FIG. 3 is a block diagram of a polyphase accumulator-based phase memory in accordance with an embodiment.

FIG. 3 illustrates an embodiment of an accumulator-based phase memory 300 that is implemented using a FPGA 311 and a waveform generator comprising a polyphase module 306. The polyphase module 306 may operate as described with respect to FIG. 2 of U.S. Pat. No. 7,768,355 (Patterson, Filed on Nov. 8, 2007, which is herein incorporated by reference in its entirety) in some embodiments. The accumulator-based phase memory 300 receives a frequency tuning word 301 at a phase correction calculator 302, which may operate as described with respect to phase correction calculator 205 of FIG. 2. The phase correction calculator 302 receives input from am integer clock divider 305 which provides a divide-by-N clock, which is connected to reference clock 309, and an increment-by-N counter 304. The phase correction calculator 302 outputs a phase correction signal to phase correction accumulator 303 whenever there is a change in the frequency tuning word 301. The phase correction accumulator 303 may operate as described with respect to phase correction accumulator 210 of FIG. 2. The phase correction accumulator 303 outputs a phase offset value to the polyphase module 306. The polyphase module 306 receives a clock signal from the divide-by-N clock 305. For example, referring to FIG. 2 of U.S. Pat. No. 7,768,355, all clocks designated with fclk are connected to the output of divide-by-N clock 305, and all clocks 4 designated Nxfclk are connected to the reference clock 309. The output of polyphase module 306 is provided to a multiplexer 307 and a DAC 308 that are located externally to the FPGA 311, and a waveform having the desired frequency and phase is output by the DAC 308 on waveform output 310. The use of the polyphase module 306 allows the entire accumulator-based phase memory to be contained in the FPGA, and the output delivered to a DAC, i.e., all of the required functionality except for the DAC can be performed inside an FPGA or other programmable logic device. FIG. 3 is shown for illustrative purposes only; any appropriate programmable logic device, such as a DSP device or ASIC, may perform the functions of the FPGA 311 in various embodiments.

Figure 4:
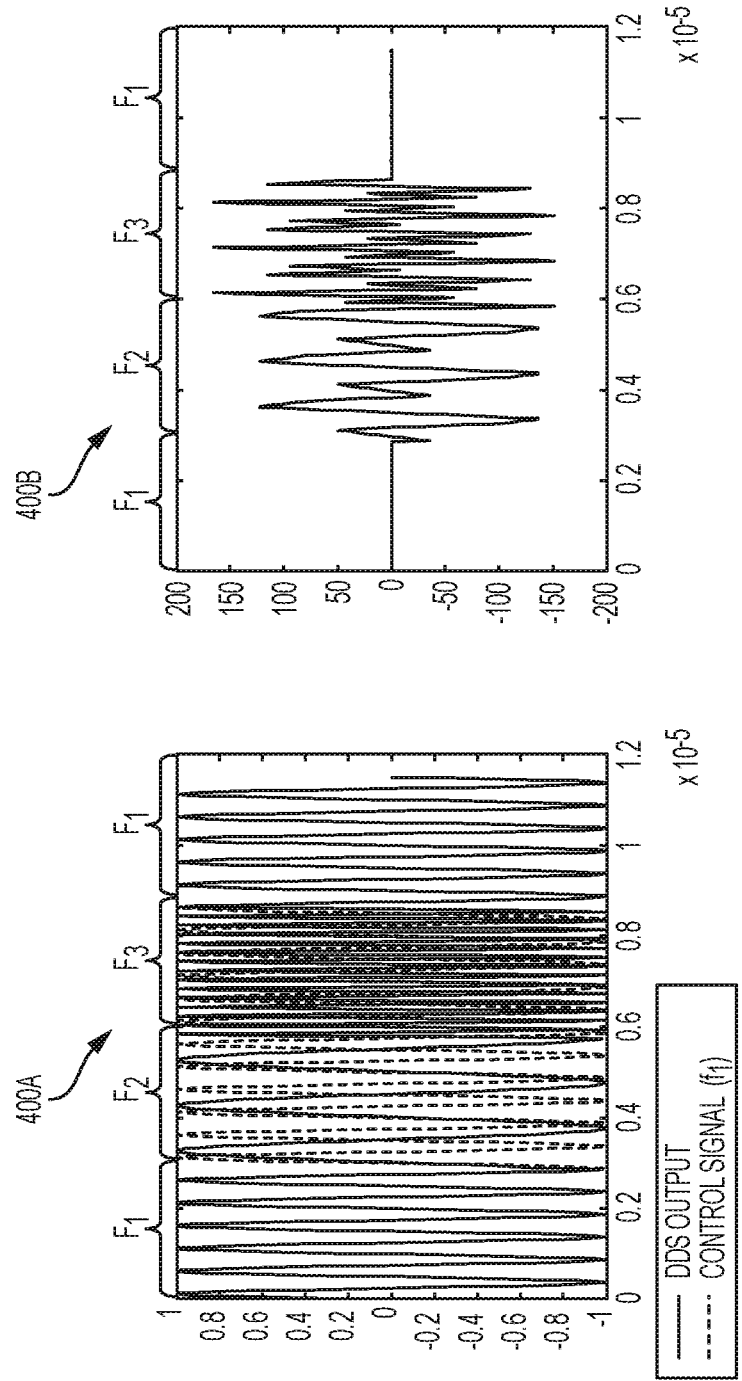
FIG. 4 shows an example output of an accumulator-based phase memory.

FIG. 4 illustrates graphs of example outputs of an accumulator-based phase memory as described above with respect to FIGS. 1-3. Graph 400A shows the output of a counter-base phase memory changing through three frequencies, F1, F2, and F3, as compared to a control signal corresponding to F1. As shown in graph 400A, when the accumulator-based phase memory returns to frequency F1 after moving through frequencies F2 and F3, the phase of the output matches the phase of the control signal. Graph 400B shows the difference between the control signal and the output of the accumulator-based phase memory that was shown in graph 4A as it moves through frequencies F1, F2, and F3. As shown in graph 400B, when the output returns to F1, the phase of the control signal and the output match with a phase error of less than 1 degree root mean square (RMS).

Figure 5:
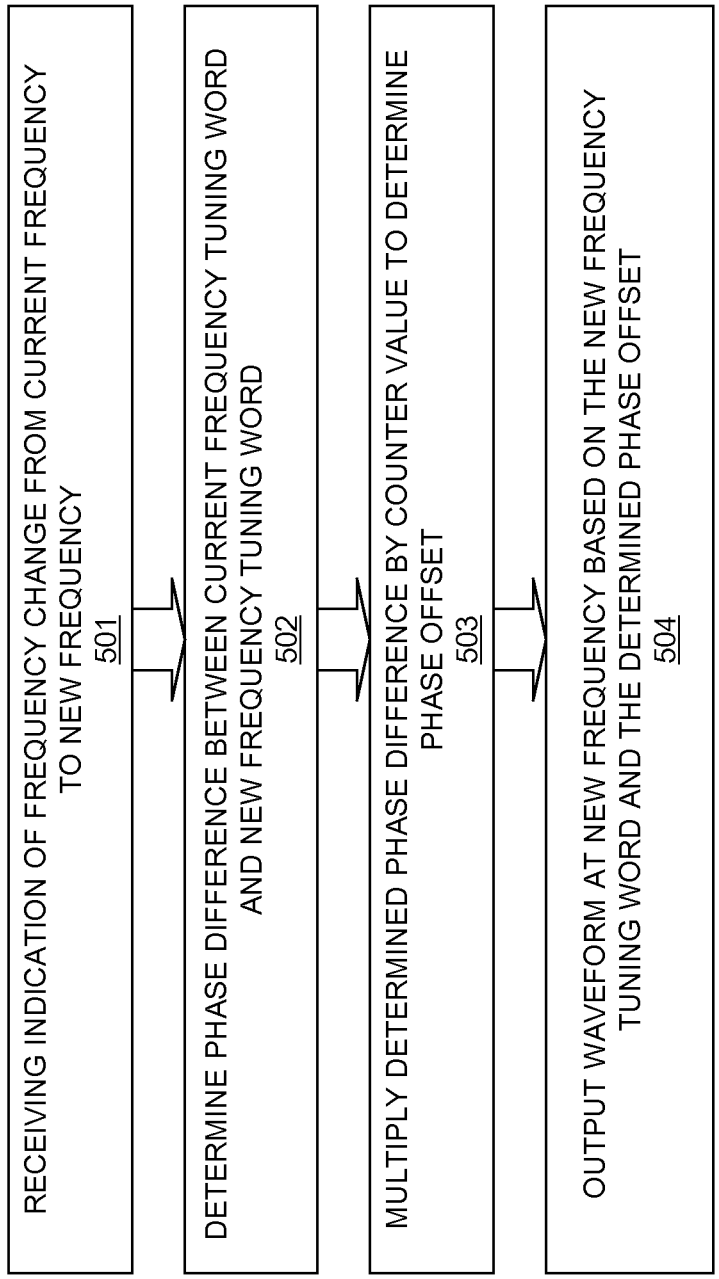
FIG. 5 is a flow chart of an embodiment of method of operating an accumulator-based phase memory.

FIG. 5 illustrates an embodiment of a method 500 for operation of an accumulator-based phase memory. Method 500 may be implemented in any of the embodiments of an accumulator-based phase memory shown in FIGS. 1-3. First, in block 501, an indication of a frequency change from a current frequency to a new frequency is received by the accumulator-based phase memory. The indication of the frequency change may be received on a frequency tuning word input, such as frequency tuning word inputs 101, 203, or 301 as shown in FIGS. 1-3. Next, in block 502, the phase difference between the current frequency tuning word, or delta-phase value, and the new frequency tuning word, or delta-phase value, is determined. In some embodiments, the phase difference may be determined using a phase correction calculator, which may comprise any of the phase correction calculators 102, 205, or 302 as shown in FIGS. 1-3. The phase correction calculator may comprise a register, which holds the old frequency turning word during the frequency change, and a subtractor, as shown in phase correction calculator 205 of FIG. 2. Next, in block 503, the determined phase difference is multiplied by the value of a counter to determine a phase offset. The counter may comprise an increment-by-N counter that is maintained by the accumulator-based phase memory. In some embodiments, the N by which the counter is incremented may be the same as an N used in a divide-by-N clock that output a signal that controls the register in the phase correction calculator. The multiplication may be performed by a multiplier located in the phase correction calculator, such as element 209 of FIG. 2. Calculating the phase offset may further include use of a phase correction accumulator 103, 210, or 303, as shown in FIGS. 1-3. Next in block 504, an output waveform is generated based the new frequency tuning word and determined the phase offset. The output waveform is output at the new frequency, and has a phase that is coherent with any earlier waveform that was output by the accumulator-based phase memory at the new frequency. The output waveform of may be generated by a waveform generator comprising a phase accumulator 213 and a phase-to-amplitude converter 214, as shown in FIG. 2, in some embodiments, or a waveform generator comprising a polyphase module 306, a multiplexer 307, and a DAC 308, as shown in FIG. 3, in some embodiments.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:
1. An accumulator-based phase memory, comprising:
  a phase correction calculator configured to, based on receipt of a new frequency tuning word on a frequency tuning word input:
    determine a phase difference between the new frequency tuning word and a current frequency tuning word; and
    determine a product of the phase difference and a value of a counter;

wherein the accumulator-based phase memory determines a phase offset value based on the product of the phase difference and the value of the counter; and the accumulator-based phase memory further comprising a waveform generator configured to generate a waveform based on the new frequency tuning word and the phase offset value.

2. The accumulator-based phase memory of claim 1, wherein the counter comprises an increment-by-N counter;
wherein the accumulator-based phase memory further comprises a divide-by-N clock that receives a reference clock and outputs a divided clock signal; and
wherein the increment-by-N counter and the divide-by-N clock use the same N value.

3. The accumulator-based phase memory of claim 2, wherein the phase correction calculator comprises a register that is controlled by the divide-by-N clock, a subtractor, a multiplier, and the increment-by-N counter.

4. The accumulator-based phase memory of claim 2, further comprising a phase correction accumulator configured to:
receive the product of the phase difference and the value of the counter; and
output the phase offset value to the waveform generator;
wherein the phase correction accumulator comprises an adder and a register that is controlled by the divide-by-N clock.

5. The accumulator-based phase memory of claim 4, wherein the phase correction calculator and the phase correction accumulator are located on a programmable logic device comprising one of field programmable gate array (FPGA), a digital signal processor (DSP) device, and an application-specific integrated circuit (ASIC).

6. The accumulator-based phase memory of claim 5, wherein the waveform generator is located on a direct digital synthesis (DDS) device.

7. The accumulator-based phase memory of claim 6, wherein the divide-by-N clock is located on the DDS device.

8. The accumulator-based phase memory of claim 6, wherein the waveform generator comprises a phase accumulator comprising an adder and a register that is controlled by the reference clock; and
wherein the phase offset value is added to an output of the phase accumulator.

9. The accumulator-based phase memory of claim 8, the waveform generator further comprising:
a phase-to-amplitude converter located on the DDS, wherein a sum of the phase offset value and the output of the phase accumulator are provided to the phase-to-amplitude converter; and
wherein an output of the phase-to-amplitude converter is provided to a digital analog converter (DAC) that outputs a waveform having a frequency and phase specified by the new frequency tuning word.

10. The accumulator-based phase memory of claim 6, wherein a plurality of waveform generators located on a plurality of DDS devices are controlled by the programmable logic device.

11. The accumulator-based phase memory of claim 5, wherein the waveform generator comprises a polyphase module located on the programmable logic device;
wherein the polyphase module outputs a signal to a multiplexer and a digital analog converter (DAC) that are located externally to the programmable logic device; and wherein the DAC outputs a waveform having a frequency and phase specified by the new frequency tuning word.

12. A method of operating an accumulator-based phase memory, comprising:
based on receipt of a new frequency tuning word on a frequency tuning word input of the accumulator-based phase memory, determining a phase difference between the new frequency tuning word and a current frequency tuning word;
determining a product of the phase difference and a value of a counter;
determining a phase offset value based on the product of the phase difference and the value of the counter; and
generating a waveform based on the new frequency tuning word and the phase offset value.

13. The method of claim 12, wherein the counter comprises an increment-by-N counter, and further comprising a divide-by-N clock that receives a reference clock and outputs a divided clock signal, wherein the increment-by-N counter and the divide-by-N clock use the same N value.

14. The method of claim 13, wherein the phase difference between the new frequency tuning word and the current frequency tuning word, and the product of the phase difference and the value of the counter, are determined by a phase correction calculator comprising a register that is controlled by the divide-by-N clock, a subtractor, a multiplier, and the increment-by-N counter.

15. The method of claim 14, wherein the phase offset value is determined by a phase correction accumulator that receives the product of the phase difference and the value of the counter, and outputs the phase offset value, wherein the phase correction accumulator comprises an adder and a register that is controlled by the divide-by-N clock.

16. The method of claim 15, wherein the phase correction calculator and the phase correction accumulator are located on a programmable logic device comprising one of field programmable gate array (FPGA), a digital signal processor (DSP) device, and an application-specific integrated circuit (ASIC).

17. The method of claim 16, wherein the waveform generator is located on a direct digital synthesis (DDS) device.

18. The method of claim 17, further comprising adding the phase offset value to an output of a phase accumulator located on the DDS device.

19. The method of claim 18, further comprising:
providing a sum of the phase offset value and the output of the phase accumulator to a phase-to-amplitude converter; and
providing an output of the phase-to-amplitude converter to a digital analog converter (DAC) that outputs a waveform having a frequency and phase specified by the new frequency tuning word.

20. The method of claim 16, further comprising receiving the phase offset value by a polyphase module located on the programmable logic device, wherein the polyphase module outputs a signal to a multiplexer and a digital analog converter (DAC) that are located externally to the programmable logic device, and wherein the DAC outputs a waveform having a frequency and phase specified by the new frequency tuning word.

* * * * *